United States Patent
Li

(10) Patent No.: US 7,915,961 B1
(45) Date of Patent: Mar. 29, 2011

(54) POWER AMPLIFIER MULTIPLE STAGE CONTROL FOR POLAR MODULATION CIRCUIT

(75) Inventor: Yushan Li, Longmont, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 140 days.

(21) Appl. No.: 12/152,227

(22) Filed: May 13, 2008

(51) Int. Cl.
 *H03F 3/04* (2006.01)
(52) U.S. Cl. .......................................... 330/297
(58) Field of Classification Search .................. 330/129, 330/133, 134, 285, 297, 150, 310
See application file for complete search history.

(56) References Cited

U.S. PATENT DOCUMENTS

| | | | |
|---|---|---|---|
| 6,624,702 B1 | 9/2003 | Dening | |
| 6,701,138 B2 | 3/2004 | Epperson et al. | |
| 6,844,776 B2 | 1/2005 | Schell et al. | |
| 7,038,536 B2 * | 5/2006 | Cioffi et al. | 330/127 |
| 7,132,891 B1 | 11/2006 | Dening et al. | |
| 7,382,195 B2 * | 6/2008 | Chen et al. | 330/297 |
| 7,471,155 B1 * | 12/2008 | Levesque | 330/297 |

OTHER PUBLICATIONS

Biranchinath Sahu, et al., "A High Efficiency WCDMA RF Power Amplifier With Adaptive, Dual-Mode Buck-Boost Supply and Bias-Current Control", IEEE Microwave and Wireless Components Letters, vol. 17, No. 3, Mar. 2007, p. 238-240.

Bumman Kim, et al., "High Efficiency RF Transmitter Architectures Modulating Power Supply", TELSIKS 2007, Sep. 26-28, 2007, p. 149-155.

Yushan Li, et al., "High Efficiency Wide Bandwidth Power Supplies for GSM and EDGE RF Power Amplifiers", 2005 IEEE, p. 1314-1317.

V. Yousefzadeh, et al., "Efficiency Optimization in Linear-Assisted Switching Power Converters for Envelope Tracking in RF Power Amplifiers", 2005 IEEE, p. 1302-1305.

Yushan Li, "Circuit and Method for RF Power Amplifier Power Regulation and Modulation Envelope Tracking", U.S. Appl. No. 11/701,747, filed Feb. 2, 2007.

Yushan Li, "System and Method for Providing A Dynamically Configured Low Drop Out Regulator With Zero Quiescent Current and Fast Transient Response", U.S. Appl. No. 12/008,852, filed Jan. 15, 2008.

Yushan Li, et al., "System and Method For Suppressing Load Transients in Radio Frequency Power Amplifier Switching Power Supplies", U.S. Appl. No. 12/008,843, filed Jan. 15, 2008.

* cited by examiner

*Primary Examiner* — Khanh V Nguyen

(57) ABSTRACT

A power amplifier is provided that includes a plurality of stages. Each of the stages is capable of being controlled by a first supply voltage or a second supply voltage. The first supply voltage is provided by a linear amplifier, and the second supply voltage is provided by a switching converter. A first stage is capable of being controlled by the first supply voltage, and a second stage is capable of being controlled by the second supply voltage.

20 Claims, 2 Drawing Sheets

US 7,915,961 B1

POWER AMPLIFIER MULTIPLE STAGE CONTROL FOR POLAR MODULATION CIRCUIT

TECHNICAL FIELD

This disclosure is generally directed to power amplification. More specifically, this disclosure is directed to a circuit for power amplifier multiple stage control for polar modulation.

BACKGROUND

Many circuits employ power amplifiers, such as RF power amplifiers in handheld communication devices and other wireless devices. Power amplifiers are often controlled by adjusting a supply voltage provided to the power amplifiers. A low drop out (LDO) linear amplifier is routinely used to generate the supply voltage for a power amplifier.

Linear amplifiers can be very efficient when used to generate the supply voltage for a power amplifier. For example, when the supply voltage is very close to the power supply of a linear amplifier (often a battery voltage), the linear amplifier is typically very efficient. However, when the supply voltage is far below the battery voltage, the linear amplifier may be very inefficient.

Linear amplifiers can also be designed to have extremely low noise and very high bandwidth. The low noise property is often important because there can be strict linearity requirements placed on power amplifiers and any noise in the supply voltage can translate into power amplifier output noise. The high bandwidth property is also often important because there can be spectral mask and time mask requirements in different communication systems, such as when the supply voltage needs to be fully ramped up or down rapidly and when the supply voltage needs to maintain its modulation dynamics.

Switching converters can provide high efficiency, but they typically have limited bandwidth. This may be due to several reasons, such as high switching losses at high switching frequencies, low resonant frequencies of external inductor-capacitor components, and control difficulties. Also, switching converters typically produce switching noise at the desired switching frequencies. As a result, typical switching converters are inappropriate for use in generating a supply voltage requiring envelope tracking or short time masks for a power amplifier.

One solution proposed to resolve these problems includes a switcher that provides a supply voltage for a linear amplifier, which in turn provides a supply voltage and envelope tracking for the power amplifier. For example, the switcher may generate the peak power needed by the linear amplifier, and the linear amplifier may fine tune its output to make sure its output tracks a reference input voltage. In this way, the supply voltage for the power amplifier may be generated in a more efficient manner by combining the properties of switching converters and linear amplifiers.

However, the linear amplifier for this solution has to pass the full load current to the power amplifier. Consequently, the linear amplifier has a non-negligible loss associated with its operation. For standards demanding a large amount of bandwidth, such as 20 MHZ for LTE, the high bandwidth may be difficult to achieve without the linear amplifier consuming a large quiescent current due to the large amount of current being provided to the power amplifier. Thus, this system may be highly inefficient in this scenario. In addition, for applications with a high peak/average ratio, such as OFDM for WiMax, a high dropout associated with the linear amplifier may result in a much less efficient linear amplifier.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
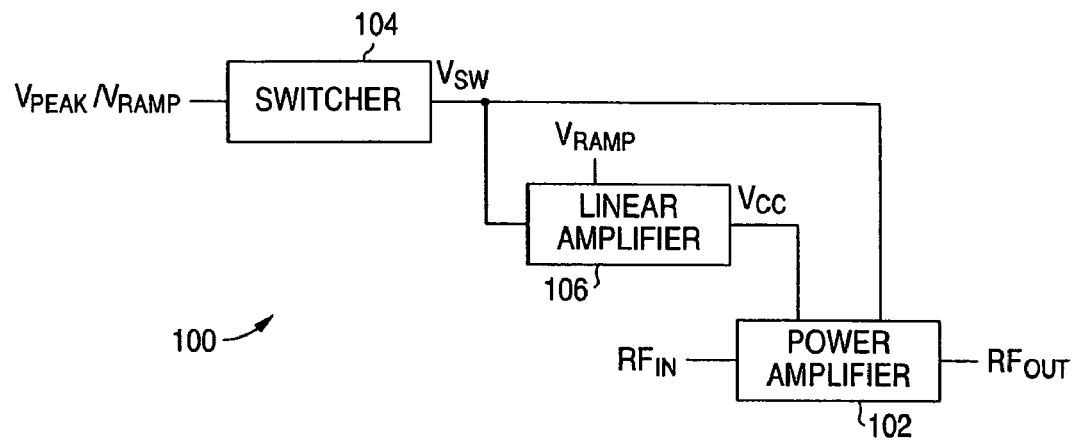
FIG. 1 illustrates a circuit for power and modulation control of a power amplifier in accordance with one embodiment of this disclosure.

FIG. 1 is a block diagram illustrating a circuit 100 for power and modulation control of a power amplifier 102 in accordance with one embodiment of this disclosure. In addition to the power amplifier 102, the circuit 100 comprises a switching converter (or switcher) 104 and a linear amplifier 106. For the illustrated embodiment, the power amplifier 102 represents an RF power amplifier that is capable of receiving and amplifying an RF input signal, $RF_{IN}$, to produce an RF output signal, $RF_{OUT}$. For some embodiments, the power amplifier 102 may receive a constant bias, while for other embodiments, the power amplifier 102 may receive a varying bias.

The power amplifier 102 is coupled to, and is controlled by, both the switcher 104 and the linear amplifier 106. The switcher 104 generally performs power control (such as peak power regulation) and the linear amplifier 106 generally performs modulation control (such as envelope tracking) for the power amplifier 102.

The switcher 104 comprises a switching converter that is capable of receiving a reference input voltage (either $V_{RAMP}$ or $V_{PEAK}$) and generating an output voltage, $V_{SW}$, based on the reference input voltage. The voltage $V_{PEAK}$ may represent a peak value of either $V_{RAMP}$ or a scaled version of $V_{RAMP}$. $V_{PEAK}$ may be obtained in any suitable manner, such as by identifying $V_{PEAK}$ based on $V_{RAMP}$ or by receiving $V_{PEAK}$ from a transceiver, baseband circuitry, or a power detector. The switcher 104 comprises any suitable type of switching converter for generating a regulated output voltage, such as a buck, boost, or buck-boost switching converter.

The linear amplifier 106, which is coupled to the switcher 104, includes at least one component (such as a transistor) that is supplied by the voltage $V_{SW}$ generated by the switcher 104. The linear amplifier 106 is capable of receiving and amplifying the reference input voltage, $V_{RAMP}$, to generate a tracked output voltage, $V_{CC}$. The linear amplifier 106 comprises any suitable amplifier for amplifying a voltage, such as a low-dropout (LDO) linear amplifier. Although the illustrated embodiment of the circuit 100 includes a single linear amplifier 106, it will be understood that the circuit 100 may include any suitable number of linear amplifiers 106.

The power amplifier 102, which comprises a plurality of stages, may be capable of receiving both the voltage $V_{SW}$ from the switcher 104 and the voltage $V_{CC}$ from the linear amplifier 106. As described in more detail below, each stage of the power amplifier 102 is capable of operating using one of $V_{SW}$ and $V_{CC}$ as a supply voltage. For some embodiments, at least one of the stages uses $V_{SW}$ and at least one of the stages uses $V_{CC}$ as a supply voltage. In addition, for some embodiments, the linear amplifier 106 may be capable of providing the output voltage $V_{CC}$ or another suitable output voltage as a bias, instead of as a supply voltage, to one or more of the stages of the power amplifier 102.

In the illustrated embodiment, the switcher 104 may be capable of providing the full load current to the power amplifier 102, and the linear amplifier 106 may be capable of providing a smaller load current to the power amplifier 102. The switcher 104 may generate the peak power for the linear amplifier 106, and the linear amplifier 106 may fine tune its output voltage $V_{CC}$ to make sure that $V_{CC}$ tracks the reference input voltage $V_{RAMP}$. In this way, the circuit 100 is capable of generating the supply voltages $V_{SW}$ and $V_{CC}$ and/or a bias for the stages of the power amplifier 102 in a highly efficient manner by combining the properties of switching converters and linear amplifiers. The linear amplifier 106 can be used to achieve low noise and high bandwidth and to provide the supply voltage $V_{CC}$ and/or a bias, while the switcher 104 can be used to provide the supply voltage $V_{SW}$ with high efficiency.

Figure 2:
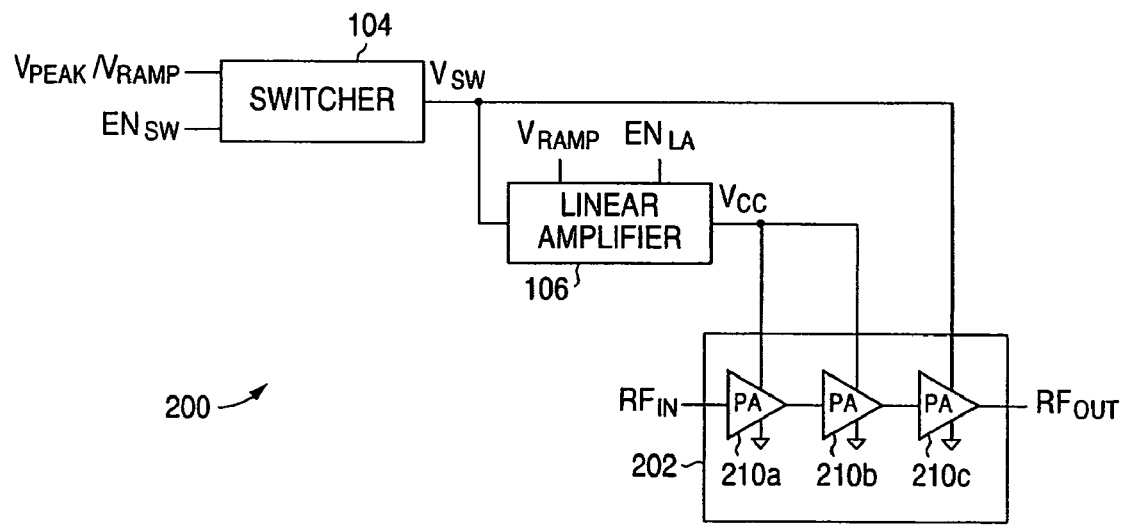
FIG. 2 illustrates the circuit of FIG. 1 in accordance with a particular embodiment of this disclosure.

FIG. 2 illustrates a circuit 200 that represents one implementation of the circuit of FIG. 1 in accordance with a particular embodiment of this disclosure. For this embodiment, the circuit 200 comprises a power amplifier 202, a switcher 204, and a linear amplifier 206. The power amplifier 202 represents one particular example of the power amplifier 102. Similarly, the switcher 204 and the linear amplifier 206 represent examples of the switcher 104 and the linear amplifier 106, respectively, in one particular configuration.

The switcher 204 in this example receives the reference input voltage $V_{RAMP}$ or $V_{PEAK}$ and an enable signal $EN_{SW}$, and the linear amplifier 206 receives the reference input voltage $V_{RAMP}$ and an enable signal $EN_{LA}$. The enable signal $EN_{SW}$ may be used to enable and disable the switcher 204, and the enable signal $EN_{LA}$ may be used to enable and disable the linear amplifier 206. The use of the enable signal $EN_{SW}$ may, for example, allow the switcher 204 to be disabled to save power when the power amplifier 202 is disabled. The enable signal $EN_{SW}$ may be provided prior to the enable signal $EN_{LA}$ so that the switcher 204 has sufficient time to reach a steady state before the linear amplifier 206 is activated. In this way, the voltage $V_{SW}$ supplied by the switcher 204 to the linear amplifier 206 may be available when the linear amplifier 206 is activated.

For the illustrated embodiment, the power amplifier 202 comprises three stages 210a, 210b and 210c. As described above in connection with FIG. 1, the different stages 210a-c may receive different supply voltages. For some polar modulation applications, each stage other than a final stage may receive the voltage $V_{CC}$ from the linear amplifier 106 and the final stage may receive the voltage $V_{SW}$ from the switcher 204.

Thus, the illustrated embodiment may correspond to such a polar modulation application because the first two stages 210a and 210b each receive the voltage $V_{CC}$ from the linear amplifier 106, while the final stage 210c receives the voltage $V_{SW}$ from the switcher 204. For this embodiment, the non-final stages 210a-b may comprise non-linear amplifying stages, and the final stage 210c may comprise a linear amplifying stage. This is because the envelope for the non-final stages 210a-b is handled by the supply voltage $V_{CC}$, and an input to the final stage 210c includes the envelope but that stage 210c is supplied by the supply voltage $V_{SW}$, which does not contain modulation information. This circuit 200 results in a more efficient linear amplifier 206, but the final stage 210c of the power amplifier 202 is less efficient due to its input having a wide dynamic range below its supply voltage $V_{SW}$. However, overall, the circuit 200 has a higher efficiency than would be possible if each stage 210a-c received the same supply voltage.

In addition, for this embodiment, the linear amplifier 206 passes a relatively small current to the non-final stages 210a-b of the power amplifier 202 because the final stage 210c, which is supplied by the switcher 204, delivers the dominant power for the power amplifier 202. Consequently, the loss associated with the operation of the linear amplifier 206 is greatly reduced as compared to a circuit in which the linear amplifier 206 provides the full load current to each stage 210a-c of the power amplifier 202. Furthermore, the linear amplifier 206 handles a small fraction of the total power needs of the power amplifier 202. As a result, the linear amplifier 206 may be made much higher bandwidth with less current to be delivered to the non-final stages 210a-b. Also, the linear amplifier 206 is much more efficient for high peak/average ratio applications because the linear amplifier loss is only associated with a fraction of the total delivered power.

Figure 3:
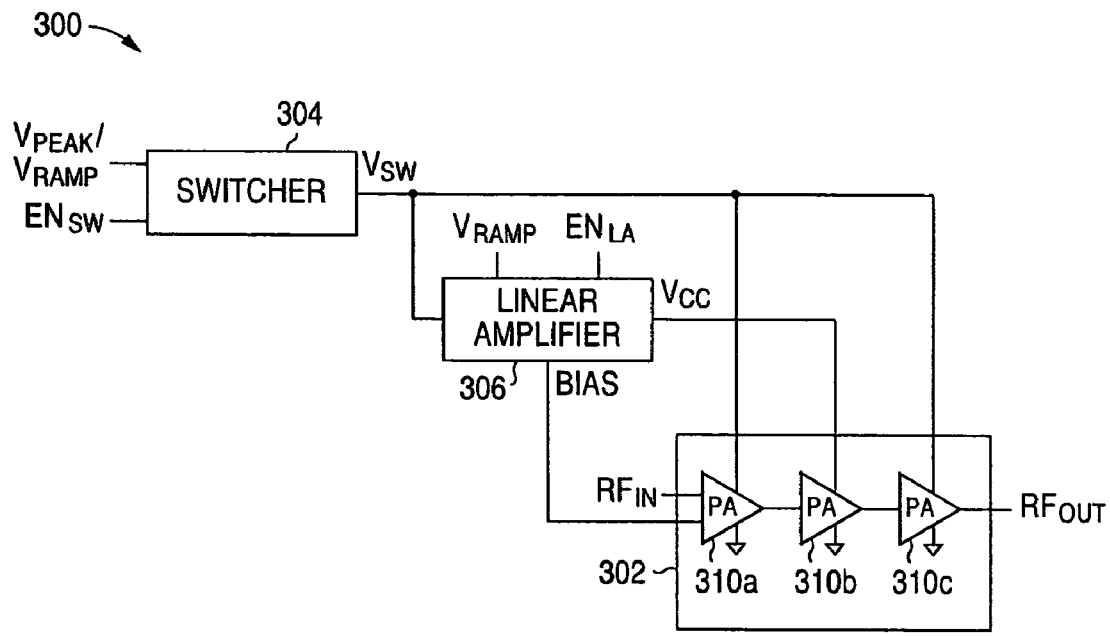
FIG. 3 illustrates the circuit of FIG. 1 in accordance with another particular embodiment of this disclosure.

FIG. 3 illustrates a circuit 300 that represents one implementation of the circuit of FIG. 1 in accordance with another particular embodiment of this disclosure. For this embodiment, the circuit 300 comprises a power amplifier 302, a switcher 304, and a linear amplifier 306. The power amplifier 302 represents one particular example of the power amplifier 102. Similarly, the switcher 304 and the linear amplifier 306 represent examples of the switcher 104 and the linear amplifier 106, respectively, in one particular configuration.

The switcher 304 in this example receives the reference input voltage $V_{RAMP}$ or $V_{PEAK}$ and an enable signal $EN_{SW}$, and the linear amplifier 306 receives the reference input voltage $V_{RAMP}$ and an enable signal $EN_{LA}$. The enable signal $EN_{SW}$ may be used to enable and disable the switcher 304, and the enable signal $EN_{LA}$ may be used to enable and disable the linear amplifier 306. The use of the enable signal $EN_{SW}$ may, for example, allow the switcher 304 to be disabled to save power when the power amplifier 302 is disabled. The enable signal $EN_{SW}$ may be provided prior to the enable signal $EN_{LA}$ so that the switcher 304 has sufficient time to reach a steady state before the linear amplifier 306 is activated. In this way, the voltage $V_{SW}$ supplied by the switcher 304 to the linear amplifier 306 may be available when the linear amplifier 306 is activated.

For the illustrated embodiment, the power amplifier 302 comprises three stages 310a, 310b and 310c. As described above in connection with FIG. 1, the different stages 310a-c may receive different supply voltages and/or biases. For this embodiment, the second stage 310b receives the voltage $V_{CC}$ from the linear amplifier 106 as a supply voltage, while the first and final stages 310a and 310c each receive the voltage $V_{SW}$ from the switcher 304 as a supply voltage. In addition, the first stage 310a receives a bias voltage from the linear amplifier 306. Thus, for this embodiment, the linear amplifier 306 is capable of performing envelope tracking via a bias control of the power amplifier's first stage 310a. Depending on the particular implementation of the circuit 300, the bias voltage may be the same as or different from the voltage $V_{CC}$.

Although FIGS. 2 and 3 show two particular implementations of the circuit 100, it will be understood that many different combinations may be implemented in accordance with the teachings of the present disclosure. For example, the power amplifier 102 may have any suitable number of stages. In addition, each stage may be controlled through its supply voltage, bias or input. Thus, any one of these controlling factors may be selected for each of the stages of the power amplifier 102 in order to optimize the overall efficiency of the circuit 100 and to overcome individual control limitations. For example, the gain, the bias and/or the supply voltage of each stage may be adjusted such that the final stage efficiency is optimized without resulting in a back-off condition at the peak power level.

Thus, in general, the different supply voltages, $V_{SW}$ and $V_{CC}$, may be provided to the stages of the power amplifier 102 in any suitable combination, and a bias generated by the linear amplifier 106 may be provided to any one or more (or none) of the stages of the power amplifier 102. Any stage receiving $V_{SW}$ for a supply voltage may comprise a linear amplifying stage and any stage receiving $V_{CC}$ for a supply voltage may comprise a non-linear amplifying stage. Allowing different controlling factors for the different stages of the power amplifier 102 results in a flexible power amplifier 102 that may be compatible with any suitable system requirements. For example, the circuit 200 is compatible with a transceiver generating polar modulation outputs, i.e., a constant envelope with the phase information provided in $RF_{IN}$ to the power amplifier 202 and the amplitude provided in $V_{RAMP}$ to the linear amplifier 206.

Figure 4:
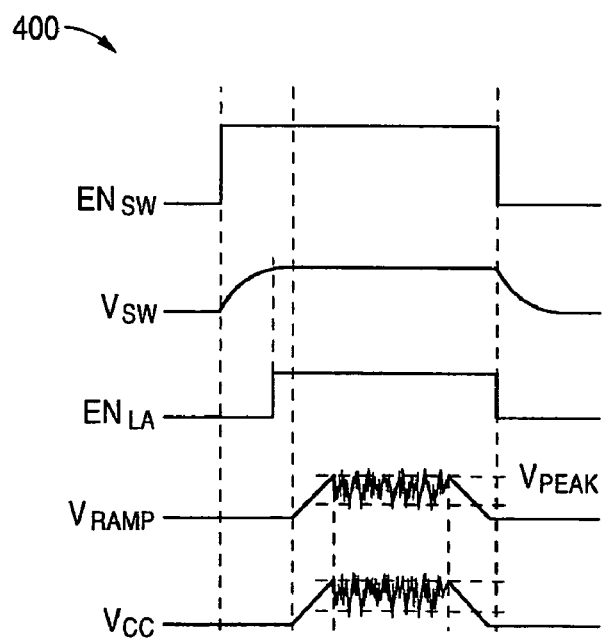
FIG. 4 illustrates a timing diagram for the circuits of FIGS. 1-3 in accordance with one embodiment of this disclosure.

FIG. 4 illustrates a timing diagram 400 for the circuits of FIGS. 1-3 in accordance with one embodiment of this disclosure. As shown in the timing diagram 400, $V_{RAMP}$ can transition from a low value (such as 0V) to a high value (such as 1.55V) within a given amount of time (such as 10 µs). If $V_{RAMP}$ is used to convey modulation information, $V_{RAMP}$ can vary near its high value and has a peak voltage $V_{PEAK}$. Otherwise, $V_{RAMP}$ can represent a flat or steady voltage. The change in $V_{RAMP}$ may cause a corresponding change in $V_{CC}$, which transitions from a low value (such as 0V) to a high value (such as 3.5V) within approximately the same amount of time. Again, $V_{CC}$ can vary if it contains modulation information.

The transition in $V_{CC}$ results in a load current being supplied to at least one stage of the power amplifier, and the load current can transition from a low value (such as 0 A) to a high value (such as A) within approximately the same amount of time. Similarly, the transition in $V_{SW}$ results in a load current being supplied to at least one stage of the power amplifier, and the load current can transition from a low value (such as 0 A) to a high value (such as 1.2 A) within approximately the same amount of time.

$V_{RAMP}$, $V_{CC}$, $V_{SW}$ and the load currents may remain at their high levels for any suitable amount of time (such as 542.8 µs). $V_{RAMP}$ can then transition from its high value to its low value, causing $V_{CC}$, $V_{SW}$ and the load currents to transition to their low values. These transitions can also occur within a given amount of time (such as 10 µs).

If enable signals (such as $EN_{SW}$ and $EN_{LA}$) are used in the circuit (such as in circuits 200 and 300), the enable signals may behave as shown in FIG. 4. When the enable signal $EN_{SW}$ transitions high, the output of the switcher (denoted $V_{SW}$) increases until eventually reaching a steady state. At that point, the enable signal $EN_{LA}$ can transition high, enabling the linear amplifier. $V_{RAMP}$, $V_{CC}$, $V_{SW}$ and the load currents can then behave as described above.

In general, the switcher in the various circuits shown and described above may be efficient over a wide output range, but the switcher may have limited bandwidth for modulation control (envelope tracking). On the other hand, the linear amplifier (or one of the linear amplifiers) may be efficient if its output and its input (or its supply from the switcher) are close. The linear amplifier may be inefficient if its output is much lower than its input, but the linear amplifier can be designed to have high bandwidth. This may make it much easier to achieve envelope tracking or other modulation control and still properly handle the power provided by the switcher.

In the described embodiments, $V_{CC}$ and $V_{SW}$ represent the supply voltages provided to the stages of the power amplifier. The switcher may be used to generate the peak power desired for the linear amplifier, and the linear amplifier may fine tune its output to make sure its output tracks its reference ($V_{RAMP}$). The linear amplifier may also provide modulation control by adjusting the power amplifier's bias (as in FIG. 3). In each of the circuits 100, 200 and 300, the linear amplifier handles much less current than the full load current associated with $V_{SW}$.

The circuits shown and described above could be used in devices or systems that support various communication standards. For example, the circuits could be used in a polar Enhanced Data rates for Global Evolution (EDGE) or other device or system. In polar EDGE, 8PSK modulation is used with a peak-to-average ratio of about 3.5 dB. In order to help maintain high efficiency of the linear amplifier, the output of the switcher is controlled so that it is close to the desired $V_{CC}$. In polar EDGE, it may be difficult to meet both the power control range (about 30 dB) and modulation dynamics (about 17 dB) by the switcher alone, so the switcher handles the 30 dB power control, and the linear amplifier handles the 17 dB modulation dynamics.

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A power amplifier, comprising:
   a plurality of stages, wherein each of the stages is configured to be controlled by one of: a first supply voltage from a linear amplifier and a second supply voltage from a switching converter, wherein a first of the stages is configured to be controlled by the first supply voltage and a second of the stages is configured to be controlled by the second supply voltage, and wherein the linear amplifier comprises at least one component that is supplied by the second supply voltage.

2. The power amplifier of claim 1, wherein the first stage comprises a non-final stage and the second stage comprises a final stage.

3. The power amplifier of claim 2, wherein the non-final stage comprises a non-linear amplifying stage and the final stage comprises a linear amplifying stage.

4. The power amplifier of claim 2, wherein a third stage is configured to be controlled by the first supply voltage, and wherein the third stage comprises a non-final stage.

5. The power amplifier of claim 1, wherein the second stage is further configured to be controlled by a bias provided by the linear amplifier.

6. The power amplifier of claim 1, wherein the linear amplifier is coupled to the switching converter.

7. A circuit, comprising:
 a linear amplifier configured to generate a first supply voltage;
 a switching converter coupled to the linear amplifier, the switching converter configured to generate a second supply voltage; and
 a power amplifier coupled to the linear amplifier and the switching converter, the power amplifier configured to receive an input signal and the first and second supply voltages and to generate an amplified output signal based on the input signal and the first and second supply voltages, the power amplifier comprising a plurality of stages, wherein a first of the stages is configured to be supplied by the first supply voltage and a second of the stages is configured to be supplied by the second supply voltage.

8. The circuit of claim 7, the linear amplifier further configured to receive a first reference input voltage and to generate the first supply voltage based on the first reference input voltage.

9. The circuit of claim 7, the switching converter further configured to receive a second reference input voltage and to generate the second supply voltage based on the second reference input voltage.

10. The circuit of claim 7, wherein a third stage is configured to be supplied by the first supply voltage, the third stage comprising a non-final stage.

11. The circuit of claim 7, wherein the first stage comprises a non-final stage and the second stage comprises a final stage.

12. The circuit of claim 11, wherein the first stage comprises a non-linear amplifying stage and the second stage comprises a linear amplifying stage.

13. The circuit of claim 7, wherein the linear amplifier comprises at least one component that is supplied by the second supply voltage.

14. A circuit, comprising:
 a linear amplifier configured to generate a bias and a first supply voltage;
 a switching converter coupled to the linear amplifier, the switching converter configured to generate a second supply voltage; and
 a power amplifier coupled to the linear amplifier and the switching converter, the power amplifier configured to receive the bias, the first supply voltage, the second supply voltage and an input signal and to generate an amplified output signal based on the bias, the first supply voltage, the second supply voltage and the input signal.

15. The circuit of claim 14, the linear amplifier further configured to receive a first reference input voltage and to generate the first supply voltage based on the first reference input voltage.

16. The circuit of claim 14, the switching converter further configured to receive a second reference input voltage and to generate the second supply voltage based on the second reference input voltage.

17. The circuit of claim 14, wherein the power amplifier comprises a plurality of stages, a first of the stages is configured to be controlled by the second supply voltage and the bias, a second of the stages is configured to be controlled by the first supply voltage, and a third of the stages is configured to be controlled by the second supply voltage.

18. The circuit of claim 17, wherein the first and second stages each comprise a non-final stage and the third stage comprises a final stage.

19. The circuit of claim 18, wherein the first and second stages each comprise a non-linear amplifying stage and the third stage comprises a linear amplifying stage.

20. The circuit of claim 14, wherein the linear amplifier comprises at least one component that is supplied by the second supply voltage.

* * * * *